United States Patent
Kunze et al.

(10) Patent No.: US 6,636,029 B1
(45) Date of Patent: Oct. 21, 2003

(54) DEVICE AND METHOD FOR CREATING ONE OR MORE MAGNETIC FIELD GRADIENTS THROUGH A STRAIGHT CONDUCTOR

(75) Inventors: Jürgen Kunze, Paderborn (DE); Gunter Schepp, Butzbach (DE); Jan Weber, Heuchelheim (DE)

(73) Assignee: Lust Antriebstechnik GmbH, Lahnau (DE)

( * ) Notice: Subject to any disclaimer, the term of this patent is extended or adjusted under 35 U.S.C. 154(b) by 0 days.

(21) Appl. No.: 09/763,542

(22) PCT Filed: Aug. 20, 1999

(86) PCT No.: PCT/EP99/06109

§ 371 (c)(1),
(2), (4) Date: Feb. 23, 2001

(87) PCT Pub. No.: WO00/11482

PCT Pub. Date: Mar. 2, 2000

(30) Foreign Application Priority Data

Aug. 25, 1998 (DE) .......................................... 198 38 536

(51) Int. Cl.$^7$ .................. G01R 33/00; G01R 33/02; G01R 33/07
(52) U.S. Cl. ............... 324/117 R; 324/117 H; 324/244; 324/251
(58) Field of Search .................. 324/107, 117 H, 324/117 R, 127, 142, 219, 244, 247, 248, 251, 252, 260, 263, 522

(56) References Cited

U.S. PATENT DOCUMENTS

| | | | |
|---|---|---|---|
| 4,794,326 A | * 12/1988 | Friedl | ..................... 324/117 R |
| 4,933,888 A | * 6/1990 | Bloyet et al. | ................. 702/86 |
| 5,180,970 A | 1/1993 | Ross | |
| 5,451,865 A | 9/1995 | Coburn | |
| 5,548,208 A | 8/1996 | Lust | |
| 6,040,690 A | * 3/2000 | Ladds | ........................ 324/142 |
| 6,132,524 A | * 10/2000 | Akinaga et al. | ............ 148/315 |
| 6,483,309 B1 | * 11/2002 | Gripshover et al. | ........ 324/331 |

FOREIGN PATENT DOCUMENTS

| | | |
|---|---|---|
| DE | 43 00 605 | 7/1994 |
| DE | 44 34 417 | 3/1996 |
| DE | 298 12 531 | 10/1998 |
| EP | 0 061 520 | 10/1982 |

OTHER PUBLICATIONS

PCIM Hong Kong, Oct. 1997 Proceedings, pp. 129–136.
EPFL/Sentron, Highly Sensitive Hall Sensor, shown at the Hannover Messe Industrie (Hannover Industrial Exposition, 1998).
H. Blanchard et al. (Cylindrical Hall Device, Proc. International Electron Devices Meeting (IEDM 1996), San Francisco, USA, Dec. 8–11, (Enclosed).

* cited by examiner

Primary Examiner—Anjan K. Deb
(74) Attorney, Agent, or Firm—Collard & Roe, P.C.

(57) ABSTRACT

Magnetic field gradients are used e.g., for potential-free current measurement without voluminous ferrite cores to minimize the influence of homogenous external interference fields on the measurement. So far, they have been provided mainly through U-shaped primary current conductors. The aim is to make it unnecessary to guide high currents through U-shaped current conductors, and to provide a device and a method for creating one or more magnetic field gradients through a straight conductor. To this end, a primary current conductor which is straight at the point where the magnetic field is measured has a recess or groove or slot for creating a magnetic field gradient. Inside or in the area surrounding this recess, the field lines take a course that enables one or more gradiometers to be positioned so that the influences of especially homogenous interference fields on the measurements are successfully minimized using simple mathematical methods such as subtraction.

31 Claims, 7 Drawing Sheets

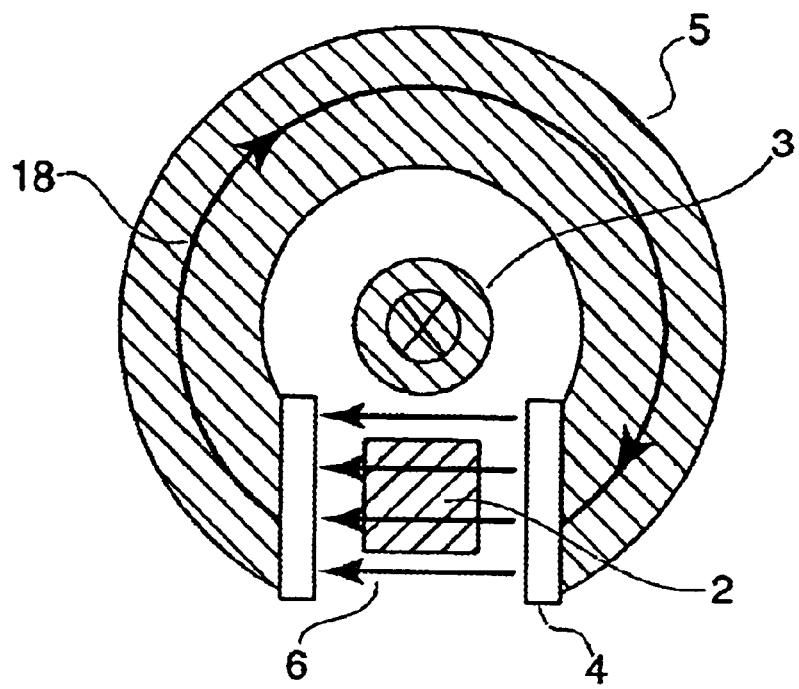
FIG. 1 - Prior Art
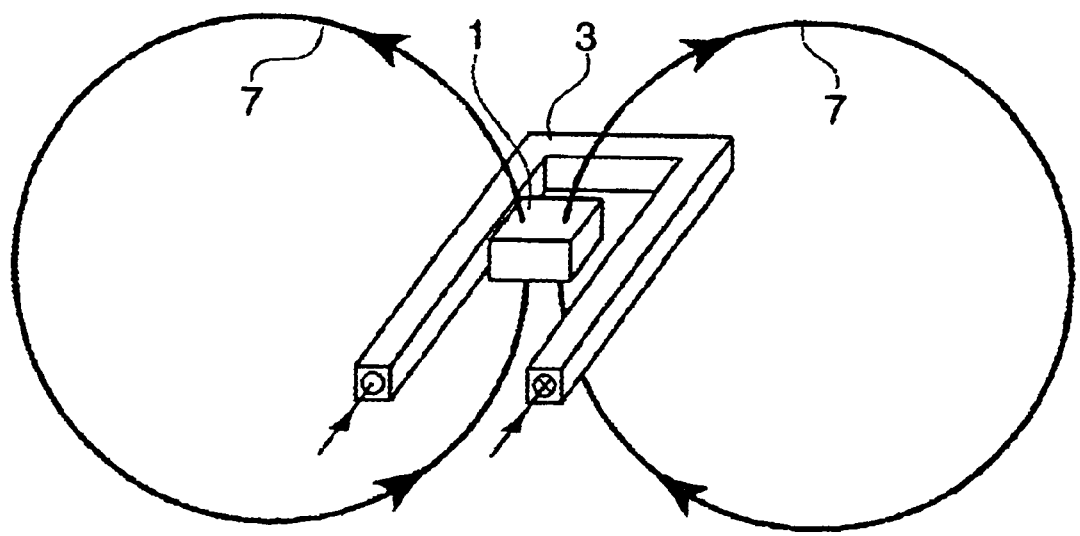
FIG. 2 - Prior Art

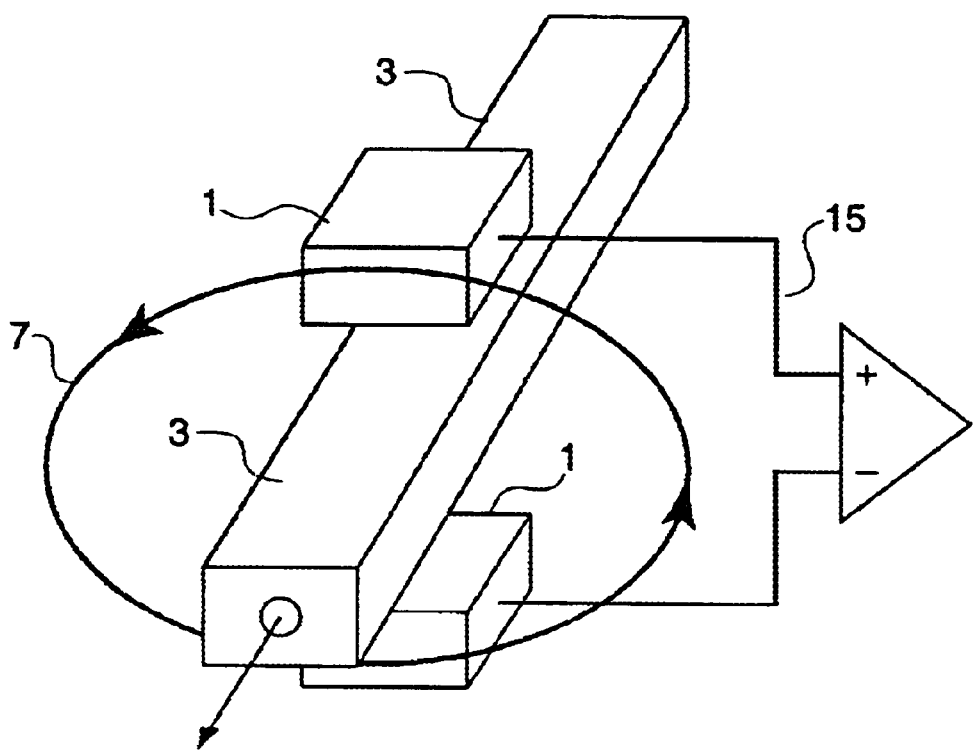
*FIG. 3 - Prior Art*
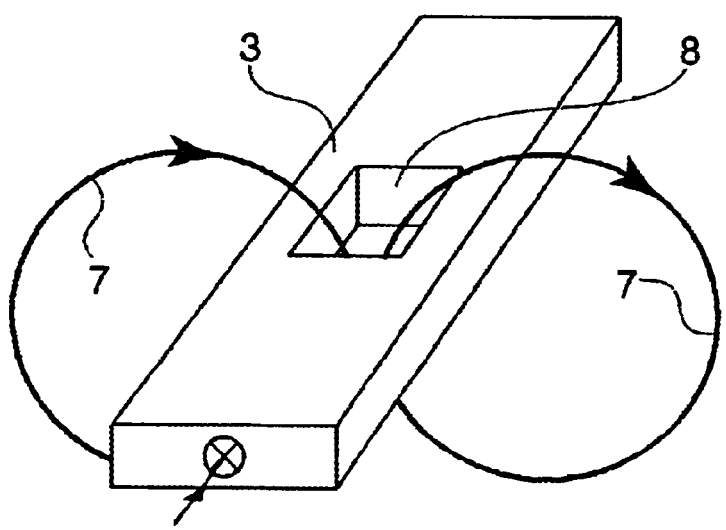
*FIG. 4*

DEVICE AND METHOD FOR CREATING ONE OR MORE MAGNETIC FIELD GRADIENTS THROUGH A STRAIGHT CONDUCTOR

CROSS REFERENCE TO RELATED APPLICATION

Applicant claims priority under 35 U.S.C. §119 of German Application No. 198 38 536.6 filed Aug. 25, 1998. Applicant also claims priority under 35 U.S.C. §365 of PCT/EP99/06109 filed Aug. 20, 1999. The international application under PCT article 21(2) was not published in English.

BACKGROUND OF THE INVENTION

1. Field of the Invention

The invention relates to a device and a method for creating one or a plurality of magnetic field gradients through a current conductor that is straight in the site where the magnetic field is measured.

The one or the plurality of magnetic field gradients so created are to be used preferably for the potential-free measurement of the current in the addressed conductor, which is preferably straight in the site where the magnetic field is measured.

2. The Prior Art

It is known to measure currents potential-free by recording their magnetic field with the help of the Hall-effect (Proceedings PCIM Hong Kong, October 1997, pages 129 ff). However, the Hall-transducers commercially available at the present time require relatively expensive and, especially when higher currents are measured, also voluminous iron or ferrite cores for concentrating the magnetic flux in the areas of the respective transducer that are sensitive to the magnetic field (FIG. 1).

Said circumstance, which has to be ascribed to the low magnetic field-sensitivity of the commercially available Hall-transducers mentioned above, has led to the development of more sensitive Hall-converters and other equipment for measuring magnetic fields.

For example, devices are known in the field of Hall transducers or Hall sensors that contain on a silicon substrate of the size of only a few square millimeters both a layer sensitive to magnetic fields, and also flux concentrators [EPFL/Sentron, Highly Sensitive Hall Sensor, shown at the Hannover Messe Industrie (Hannover Industrial Exposition, 1998); and H. BLANCHARD ET AL, Cylindrical Hall Device, Proc. International Electron Devices Meeting (IEDM) 1996), San Francisco, USA, Dec. 8–11, 1996].

Furthermore, a whole series of other methods exists for measuring the magnetic field, which, by virtue of their sensitivity, are suitable for pot potential-free current measurements without iron or ferrite cores as well.

For example, devices for measuring the magnetic field are known since a longer time that operate on the basis of magnetoresistive effects such as the anisotropic magnetoresistive effect (AMR) (Magnetoresistive Sensors III, Final Report of the Combined Project IMOMAG, BMFT Promotion ID 13 MV 0109–0120, chapter 6.1, Magnetic Field Sensor with Integrated Compensation Line MSK 6), or such as the gigantic magnetoresistive effect (GMR) (Magnetoresistive Sensors IV, Symposium and Status Seminar held on Mar. 11 and 12, 1997, in Wetzlar, chapter "MR Sensors with Giant Resistance Materials: Potencies and Problems").

Furthermore, it seems to be conceivable also in the future to produce such sensor systems on the basis of the colossal magnetoresistive effect (CMR)(loc.cit. page 7 f).

However, all sensor systems possessing a magnetic sensitivity that permits them to measure currents potential-free without the use of voluminous iron cores, have in common that they have high sensitivity to interference fields. Said circumstance is counteracted at the present time, for example in that by arranging the magnetoresistive materials employed in the respective measuring device in a special way, magnetic field gradiometers are produced that have a lower sensitivity to homogeneous fields of interference.

For example, DE 43 00 605 C2 describes a sensor chip that functions especially on the basis of the anisotropic magnetoresistance effect (AMR). Said sensor chip is capable of measuring current potential-free by recording the magnetic field gradient. Devices are also known, of course, that operate based on the GMR effect (Magnetoresistive Sensors IV, symposium and Status Seminar on Mar. 11 and 12, 1997, in Wetzlar, chapter "MR Sensors with Giant Resistance Materials: Potencies and Problems", page 4 ff) or other magnetic field-sensitive effects, such devices being devised as gradiometers.

The devices introduced above, and also the particularly sensitive Hall sensors with integrated soft-magnetic flux concentrators (EPFL/Sentron, Highly Sensitive Hall Sensor, shown at the Hannover Industrial Exposition in 1998) can be basically devised as gradiometers as well. It is only necessary for said purpose to apply, for example two magnetic field-sensitive surfaces on a silicon substrate, and to then evaluate the two generated Hall voltages in a suitable manner.

A drawback of the principle described above lies in the circumstance that of a magnetic field gradient has to be provided.

DE 43 00 605 C2 and U.S. Pat. No. 5,548,208 propose for said purpose, for example the U-shaped design of the current conductor through which the primary current to be measured is passed (FIG. 2). In both of said published documents, the actual magnetic field gradiometer is preferably applied to a carrier material separating the potential, said carrier material itself being secured on the U-shaped primary conductor.

However, the drawbacks of said principle are obvious: it is necessary to pass the current normally flowing in straight current conductors through a U-shaped primary conductor. For this purpose, massive current conductors or flat cables are interrupted especially in the high-current sector, and the conductor ends are connected in a suitable form to the connections of the U-shaped primary conductor. This method requires relatively much expenditure and it is difficult to reconcile it, most of all, with the manufacturing methods usually employed in the field of machine and vehicle manufacturing.

Therefore, an arrangement is known as well that permits with the use of at least two magnetic field measuring devices, measurements of the current without voluminous iron or ferrite cores in a manner that is relatively insensitive to homogenous fields of interference: in conjunction with DE 44 34 4177 A1, particularly two absolute-field measuring devices are arranged preferably on two sides of a straight conductor opposing each other (parallel with the direction of flow of the current) (FIG. 3). It is assured in this way that the circular magnetic field of the straight conductor penetrates the two measuring devices in the reverse direction. The output signals of both measuring devices are subtracted from each other, so that the interfering components of homogeneous interference fields are largely omitted.

Said invention, however, has inherent drawbacks as well. First of all, two magnetic field measuring devices and two potential-separating carrier substrates have to be used, as opposed to the gradiometric principle shown herein. Furthermore, the spacing between the two magnetic field measuring devices is not freely selectable because such spacing is particularly dependent upon the diameter of the primary conductor.

Said spacing, however, is decisive for the sensitivity of the arrangement to interference fields because the latter naturally change with the spacing. With simple mathematical means such as subtraction, the influences of said interference fields in the evaluation of the output signals of the absolute-field measuring devices can be minimized adequately only if such measuring devices are penetrated by approximately equal interference fields. When gradiometers are employed, the meaning of the term "basic width of the gradiometer", with respect to the sensitivity of said device versus interference fields, conforms to the spacing of the absolute-field measuring devices explained above.

The fact that the spacing between the absolute-field measuring devices is dependent on the cross section of the primary conductor in conjunction with DE 44 34 417 A1, is disadvantageous especially in the high-current area, which is characterized by both large primary conductor cross sections and high interference fields.

The invention eliminates the drawbacks of the two measuring methods described above, i.e. the use of a U-shaped primary conductor in conjunction with the gradiometric measuring method, and the predetermined base width in conjunction with the measuring method comprising at least two absolute-field measuring devices. A device and a method are proposed for said purpose that make it possible to measure current on a straight primary conductor either with the help of a gradiometer or with at least two absolute-field measuring devices, in a potential-free manner and with the elimination of external interference fields to a large extent.

Said problem is solved according to the invention in that
(a) the magnetic field gradient or gradients each are formed by a conductor that is provided with one or with a plurality of suitable recesses, for example grooves or slots, and which is preferably shaped straight in the site of the measurement; or
(b) formed by the correspondingly suitable arrangement of the conductive components forming in the site of measurement a preferably straight current conductor with one or a plurality of corresponding recesses;
and in that the magnetic field or the magnetic field gradient is measured in each case by suitable devices within the area surrounding individual recesses.

The invention permits measuring of the magnetic field gradient, for example in a groove located in a massive current conductor, said measure leads to a more compact structure and reduced manufacturing costs because the necessity of using the U-shaped design of the primary conductor is eliminated, as opposed to other gradiometer arrangements. Vis-à-vis the arrangements described above, which comprise at least two absolute field measuring devices that are arranged outside of a straight conductor, it has to be emphasized here that the realization possibility has more variability in particular for realizing base widths that are independent of the cross section of the primary conductor. It is possible in this connection to predetermine the desired base width based on the type of construction of the gradiometer employed, or to mount two or more absolute field measuring devices with the desired spacing from each other, and to then measure the magnetic field, gradient with the help of said measuring devices.

Furthermore, it can be assumed that the measurement of a magnetic field gradient located within the recess, or within its direct proximity, is afflicted with lower interference fields, to begin with, than the measurement of gradients or absolute fields located on the outside far removed from such a magnetic field gradient. At first, it seems to be difficult to explain said effect with the classic electrodynamics because the conductive materials forming the current conductor as defined by the invention can be expected to assure only screening against electrical fields, to begin with.

The addressed phenomenon, however, is measurable in a reproducible manner and can be attributed to eddy currents in the primary conductor that have a damping effect particularly on the changing outer fields causing such phenomenon.

A further aspect is added to the advantages offered herein—which are predominantly of the physical type—from the viewpoint of manufacturing technology:

In conjunction with a device according to DE 43 00 605 C2, the accuracy with which the U-shaped primary conductor is positioned in relation to the actual magnetoresistive sensor element is highly significant as far as the measuring accuracy and the measuring range of the gradiometer are concerned. In analogy to said problem, the spacing and the symmetry of the absolute field measuring devices are critical values in conjunction with a device according to DE 44 34 417 A1, whereby additional expenditure is often required for adhering to said values.

A gradiometer or an arrangement of absolute field measuring devices capable of measuring magnetic field gradients are preferably produced by technical microsystem manufacturing methods, and such gradiometers or arrangements are often intergrated with the required evaluation electronics. In conjunction with modern methods for housing and encapsulating such microsystems, the mechanical manufacturing tolerances therefore can be kept within narrow limits.

Providing the primary conductor with a recess as defined by the invention, which recess can be produced, for example by milling a groove, is already possible with the means of classical machine building with an accuracy of a few hundredth parts of a millimeter as well. For joining the two components, only plug connections as commonly used in machine and vehicle building at favorable costs or manufacturing methods available at similarly favorable cost are then required, so that no additional measures are needed any longer for assuring the required positioning accuracy.

A further advantage of the invention lies in the possibility, for example for dividing high currents by multi-slot conductors in such a way that the gradients between the individual conductor currents will not become excessively large for measuring devices that are optimized for measuring smaller currents. Said advantage carries all the more weight in light of the fact that high unit numbers and thus relatively low manufacturing costs can be assumed to be feasible in current areas where multiple subdivision of the conductor is not necessarily required. In spite of said fact, a current conductor as defined by the invention can be useful with a plurality of recesses also when the signals of the measurement received within the area surrounding different recesses as defined by the invention are mathematically linked in a clever way. Interference fields can be suppressed in this way even more effectively than by recording a gradient.

As mentioned above several times, advantageous embodiments of the invention can be realized both with monolithically integrated gradiometers or with gradiometers integrated in same other way, as well as with suitable arrangements of absolute field measuring devices.

When using gradiometers it is necessary to take into account the direction of sensitivity of the areas of the gradiometer that are sensitive to the magnetic field. Especially in conjunction with a device according to DE 43 000 605 C2, it is advantageous if the sensor chip described in said cited published document is aligned in such a way that the base substrate of said sensor chip is inclined by about 45° vis-à-vis the area that is put up by the direction of the flow of current and the center points of the cross sectional surfaces of the two conductor parts surrounding a recess as defined by the invention. It is assured in this way that the field lines will penetrate the magnetoresistive areas in a specially advantageous manner.

In conjunction with other magnetic field gradiometers capable of or operating on the basis of the GMR-, CMR- and Hall effect, or based on other magnetic field-sensitive effects, the approximately orthogonal alignment of the gradiometer in relation to said surface seems advantageous if only for technical manufacturing reasons alone. It seems to be possible also, of course, to build on the basis of the AMR effect a sensor whose magnetoresistive areas are shaped in, such a way that a straight alignment of the sensor becomes advantageous physically as well. Especially in conjunction with gradiometers operating based on the Hall effect, whose magnetic field-sensitive areas are applied to a base substrate in a planar way, an alignment of the base substrate parallel with the aforementioned surface seems to be advantageous. Irrespective of these considerations it seems possible to build with a major portion of the aforementioned effects gradiometers that can be physically arranged in the one or other way in the recess as defined by the invention, or in the area surrounding such a recess in an advantageous way, and in a manner that is favorable in terms of manufacturing technology as well.

Different arrangements are conceivable when arrangements of absolute field measuring devices and/or gradiometers are employed.

Advantageous arrangements of such measuring devices are explained in greater detail by way of example with the help of only one conductor provided having a recess as defined by the invention, in order to keep the scope of the following text within limits.

So as to able to exploit the advantages offered by said arrangements it seems to be advantageous, to begin with, if a straight number of magnetic field measuring devices or magnetic field gradient measuring devices of the same type of construction are symmetrically arranged in a groove as defined by the invention, or in the area surrounding such a groove, whereby the output signals of each of the respective measuring devices are linked within the area surrounding a recess by suitable mathematical operations such as, for example subtraction, and particularly linked in such a way that the interference components are minimized.

Furthermore, it may be advantageous also if such a measuring arrangement is put out of adjustment by suitable measures such as intentional asymmetrical mounting of such an arrangement in order to shift or expand the measuring range of the arrangement. Measures of said type seem to be particularly useful because the magnetic field gradient created in the recess as defined by the invention has a relatively low amount, as a rule:

A U-shaped current conductor is known to turn the direction of the flow of current by 180°. The means that the magentic field gradient in a plane located above the current conductor parallel with the base width of the sensor (see DE 43 00 605 C2 or FIG. 3) is often greater than the magnetic field gradient of an arrangement as defined by the invention, in conjunction with the same primary current.

Measures such as putting the magnetic field or magnetic field gradient measuring devices out of adjustment vis-à-vis the zero passage of the magnetic field can be flanked or compensated in a suitable manner by electronic measures, or through calibration.

The measures that may contribute to optimizing the magnetic flux in the area surrounding a recess as defined by the invention as well, comprise the arrangement of structural components made of materials capable of conducting the magnetic flux in a suitable manner. For example, the magnetic flux in the recess as defined by the invention is substantially increased if the conductor is partially enveloped with ferrite material. This measure, too, can be implemented both with the goal of optimizing the magnetic field gradient symmetrically in relation to the zero passage of the magnetic field, and for adapting it to the requirements of the application as well as of the measuring device, and with the intention of generating a field that is asymmetrical in relation to the zero passage.

For the purpose of realizing the last-mentioned intention, it is possible also to design the entire current conductor as defined by the invention in such a way that it is asymmetrical in relation to the recess in the direction of the current flow. Different currents or current flow densities occur in this way on both sides of the recess, which ensues the desired effect stated above.

Against the background of the state of the art in the field of microsystem technology such as, for example the flip chip technology, it is advantageous, among other things, if the gradiometers or magnetic field measuring devices are first secured on one or several carriers such as, for example foil carriers, and the microsystem so obtained is then positioned in the recess or within the proximity of the recess. A simple structure is realized in this way at favorable coat.

Another advantageous embodiment of the invention is based on the possibility that one or a plurality of magnetic field or magnetic field gradient measuring systems can be produced in such a way that such a system or such systems can be relatively exactly positioned or secured in the recess as defined by the invention. The relatively complicated positioning of the measuring systems in relation to the conductor is eliminated in this way, such positioning being normally required in order to assure exact measurements within an adequate measuring range.

Devices as defined by the invention provide the magnetic field gradients that are useful especially for the potential-free measurement of current, so that it appears to be advantageous in different current or temperature ranges or under the influence of other different environmental conditions if the measurements are carried out according to the method as defined by the invention, with the use of different magnetic field or magnetic field gradient measuring devices that operate based on a great number of different principles or effect.

The measured values so obtained; of course, often serve also for deriving or determining related values such as the voltage or the wattage.

Especially within the area of high currents, magnetic screening of the entire device or of part of the device may become necessary because of the occurrence of large interference fields, for example such as attaching additional metal parts, for example in the form of sheet metal, a vapor-deposited metal layer, or plastics containing metal particles and/or soft-magnetic materials, which in particular may be a component also of the magnetic field measuring devices themselves, for example of the sensor chips used and/or of the sensor microsystem and/or of the housing of the sensor arrangement, in order to screen such a device or a part thereof against external electromagnetic interference fields. Such a screening device can be realized with low expenditure owing to the extraordinary compactness of the measuring device.

In the presence of short-circuits or grounding, very high current flow already temporarily occurs in conjunction with devices rated for low currents. Such high currents can be easily detected by the method as defined by the invention. The output signals of the measuring devices can then be used, for example for monitoring purposes.

Owing to the compactness of the device and the possibility associated therewith for simple magnetic screening, the method is naturally particularly well-suited for detecting in a relatively confined space a plurality of currents with the help of a plurality of current conductors as defined by the invention.

Another possibility for measuring current at favorable cost ensues from the screening or screening capability as defined by the invention as well: when minimal interference fields can be expected to occur in the site where the magnetic field measured, or at the point of measurement of the magnetic field gradient when the invention is applied, it suffices if the measurement is taken only on one side of the zero passage of the magnetic field. Such a measurement can be carried out even with only an absolute field measuring device.

The preferably industrial prefabrication of the entire unit as a device for the potential-free measurement of current promises a substantial reduction of the unit cost. Units of said type can be particularly connected in a suitable manner at their conductor ends to the current conductors conducting the current to be measured. Particularly favorable in this connection are plug connections by which, for example flat cables can be connected to the units.

Another particularly advantageous way of manufacturing devices as defined by the invention can be expected to be of interest, for example in the field of automobile manufacturing:

In said field, the gradient-forming conductor as defined by the invention could be produced already as part of a final device.

Such a final device may be, for example a high-power generator, a conventional generator, a fuel cell or a fuse box. Components of said type are manufactured in very high piece numbers and consequently at relatively low cost. Furthermore, the realization of recesses as defined by the invention in the current conductors of such final device products can be expected to be possible at favorable cost as well. The devices suitable for measuring the created magnetic field gradients can then be supplied as prefabricated microsystems that are adapted to their application, and positioned in the area surrounding the recesses as defined by the invention.

Technical production measure of said type are, of course, advantageous in various forms of realization and can be expected to find use in different branches of industrial manufacture.

As mentioned above, the use of a conductor as defined by the invention comprising a plurality of recesses offers a number of various benefits. It is possible, first of all, to pass the primary current through the multiple slotting of the conductor in a way such that the measuring devices employed operate in their rated current ranges or rated field strength ranges.

A further advantage lies in the possibility for evaluating the various gradients: the values measured in the areas surrounding different recesses can be mathematically linked with each other in a manner that is suited for further minimization or elimination of the interfere components.

For the purpose of evaluating said signals as effectively as possible, it may be advantageous also if the measurement of the various magnetic field gradients is carried out by different methods.

BRIEF DESCRIPTION OF THE DRAWINGS

The problem on which the invention is based, the invention and a number of preferred embodiments of said invention are explained in the following with the help of drawings, in which:

FIG. 1 shows the basic structure of a conventional Hall transducer with flux concentration.

FIG. 2 shows with the help of a sketch the formation of the gradient as it is shown in DE 43 00 605 C2.

FIG. 3 shows the potential-free current measurement with two absolute field measuring devices as proposed by DE 44 34 417 A1.

FIG. 4 shows a sketch of an exemplified embodiment of a slotted current conductor as defined by the invention, and the curves of the field lines within the area surrounding said current conductor.

DETAILED DESCRIPTION OF THE PREFERRED EMBODIMENTS

Figure 5:
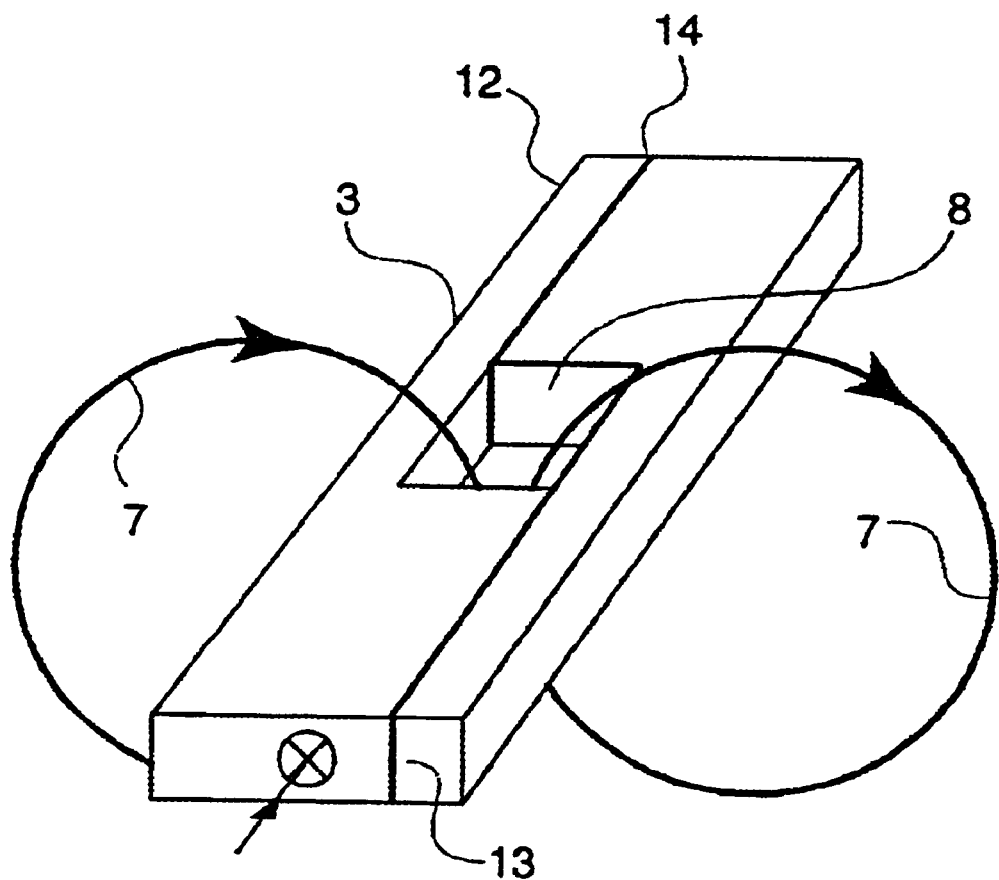
FIG. 5 shows an exemplified embodiment of a current conductor as defined by the invention, said current conductor being assembled from two conductive parts.

FIG. 1 shows the structural principle of a commercially available Hall transducer in which a ferrite or iron core (5) guides the magnetic flux (18) of a current conductor (3), which leads to a concentrated magnetic flux (6) in the area surrounding the Hall converter (2). Voluminous iron or ferrite cores are employed in conjunction with said structural principle especially in connection with high currents.

FIG. 2 shows a creation of a magnetic field gradient (1) of the type as proposed in DE 43 00 605 C2 and U.S. Pat.

No. 5,548,208, which is capable of functioning without any complicated magnetic flux guidance when a sensitive measuring system is employed. The primary current conductor (3), which is molded in a U-shaped form in the present case, creates a magnetic field gradient (1) that penetrates the gradiometer. It is possible in this way to minimize in the evaluation process the components of the interference fields.

FIG. 3 shows a device which is proposed by DE 44 34 417 A1, among other things. A straight current conductor (3) has a magnetic field with approximately circular field lines (7) whose deformations may be caused by the cross section of the conductor. Said magnetic field penetrates two absolute field measuring devices (1), which are penetrated by the magnetic field in the opposite direction. The output signals of the two measuring devices are evaluated, for example with the help of a subtracting device (15). The interference components of homogeneous external interference fields are omitted in this way to a large extent. However, the amount of the remaining interference components is dependent upon the spacing of the measuring devices from each other, whereby such spacing is in turn connected with the diameter of the conductor.

FIG. 4 shows a slotted primary conductor (3) as defined by the invention, and the curve (7) of the field lines caused by the primary current in the area surrounding the slot (8) as defined by the invention.

FIG. 5 shows the same sketch, whereby the primary conductor (3) is assembled from the conductive components (12 and 13), which are joined particularly in a conductive manner along the joint line (14). Said sketch only illustrates that the primary conductor as defined by the invention can be assembled from a multitude of suitable components.

Figure 6:
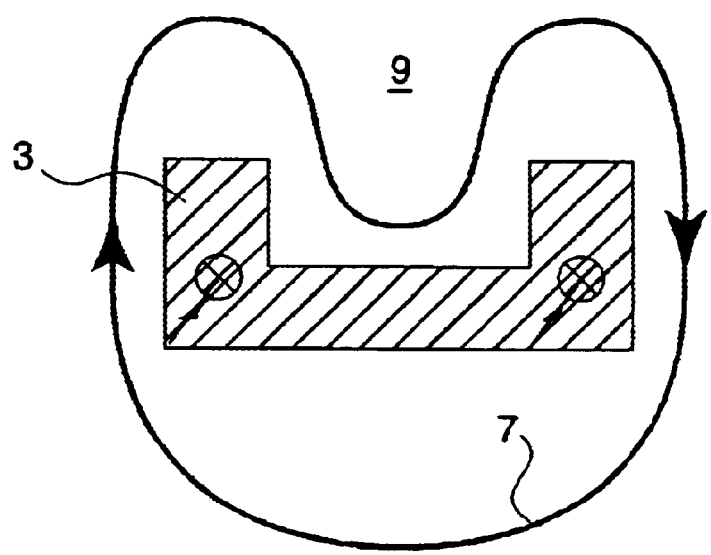
FIG. 6 shows a cross section through a conductor with a groove as defined by the invention.

FIG. 6 shows a cross section through a primary conductor (3) as defined by the invention, Instead of being provided with a through-extending slot, said primary conductor has a groove (9) serving as the recess as defined by the invention. The course of the field lines (7) is only sketched in the present figure. For reasons of superior clarity, the following figures are limited to the representation of exemplified embodiments that are provided with a through-extending slot as defined by the invention.

Figure 7:
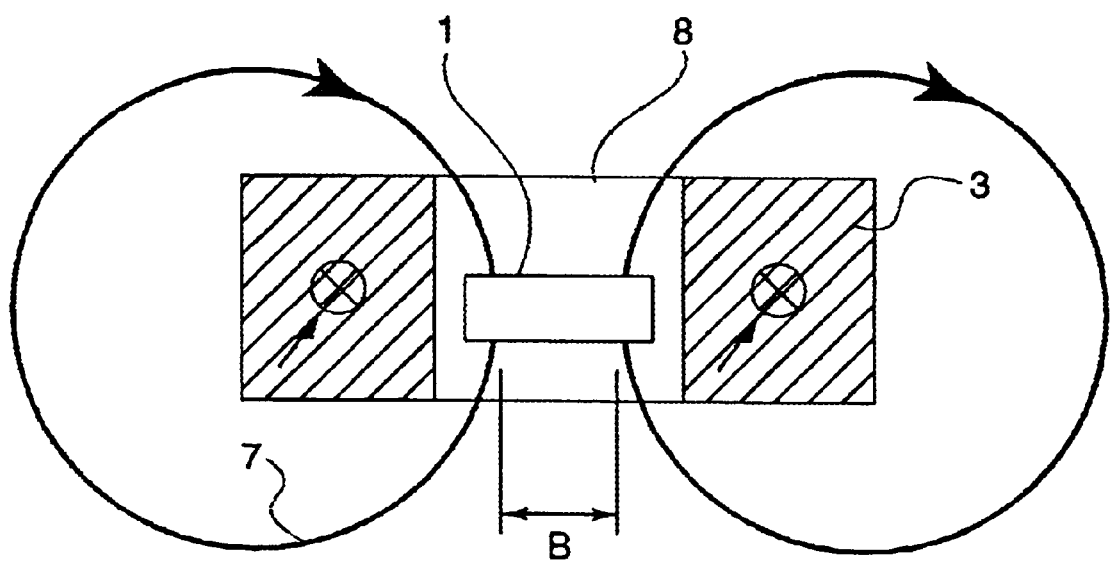
FIG. 7 shows a cross section through a slotted conductor as defined by the invention, with a gradiometer.

FIG. 7 shows a cross section through such a current conductor (3) as defined by the invention. A magnetic field measuring device (1) is located in the recess as defined by the invention. In the present exemplified embodiment, said magnetic field measuring devise is realized in the form of a magnetic field gradient measuring device. Said gradiometer is arranged symmetrically in relation to the zero passage of the magnetic field. The base substrate of the gradiometer is disposed approximately parallel with the area put up by the direction of flow of the current and the center points of the two conductor components. The measure (B) denotes the base width of the gradiometer, which is particularly preset by the spacing of different magnetic field-sensitive layers that measure the magnetic field gradient here on both sides of the zero passage.

Figure 8:
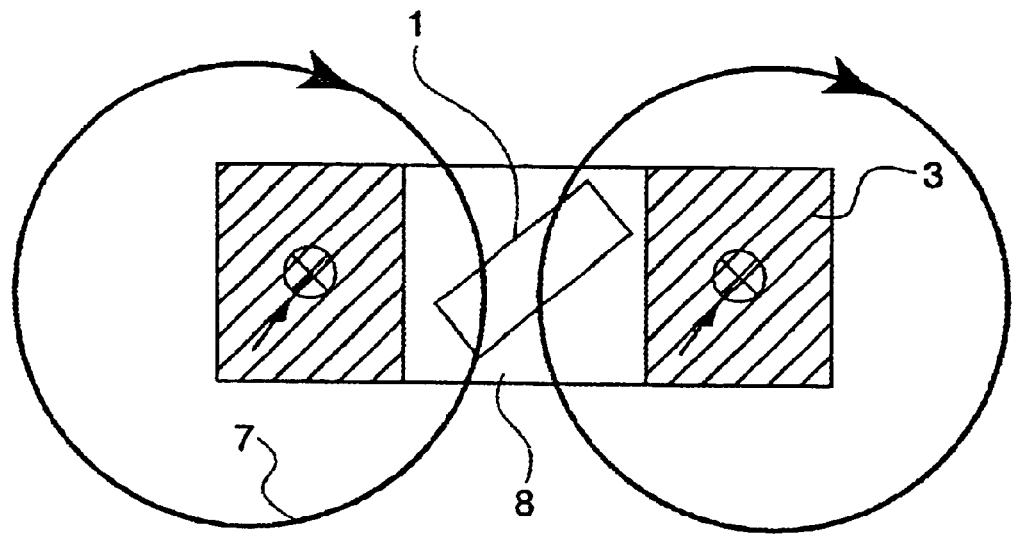
FIG. 8 shows a cross section through a slotted conductor as defined by the invention, with an inclined gradiometer.

FIG. 8 shows a substantially identical cross sectional drawing in which the gradiometer (i) is inclined vis-a-vis said area by approximately 45°.

Figure 9:
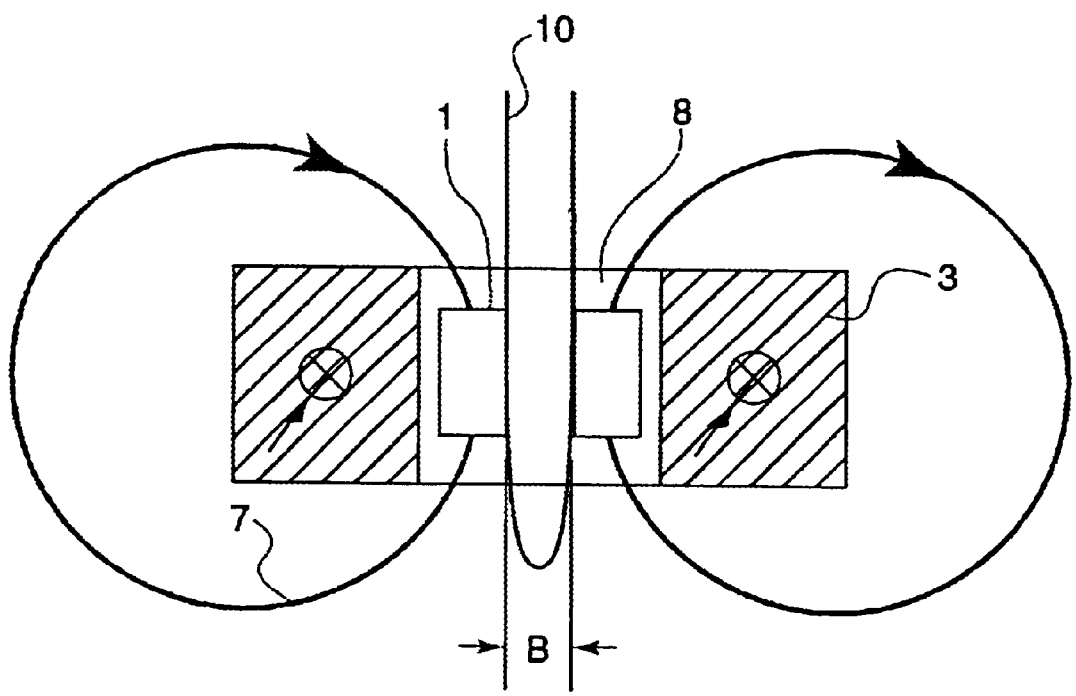
FIG. 9 shows a cross section through a slotted conductor as defined by the invention, with an arrangement of two absolute field measuring devices.

In FIG. 9, two absolute field measuring devices (1) are mounted in the recess as defined by the invention. Said absolute field measuring devices are secured on a suitable carrier (10). The spacing between the two measuring devices (1), or between their magnetic field-sensitive layers is denoted by (B) in the present case as well. In the physical sense, said spacing corresponds with the base width of the gradiometer in FIG. 7.

Figure 10:
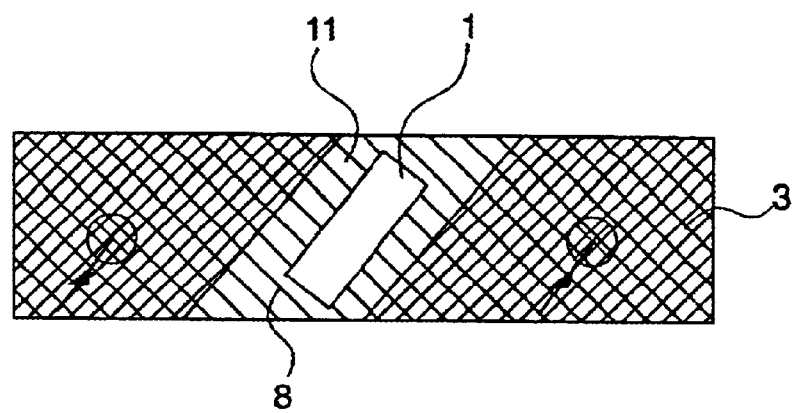
FIG. 10 shows a cross section through a slotted conductor as defined by the invention, with a slot extending in an exemplified manner for guiding the magnetic flux, and having a microsystem fitted in its slot.

FIG. 10 shows a cross section through a current conductor (3) as defined by the invention. Said current conductor has a recess (8) whose alignment is determined less by technical production considerations than physical ones. However, the significance of said special alignment is only exemplary. Furthermore, FIG. 10 shows a magnetic field or magnetic field gradient measuring device (1) that is inserted in a part of a microsystem (11) that fits in the recess (8) and has to be positioned there with adequate accuracy and low expenditure.

Figure 11:
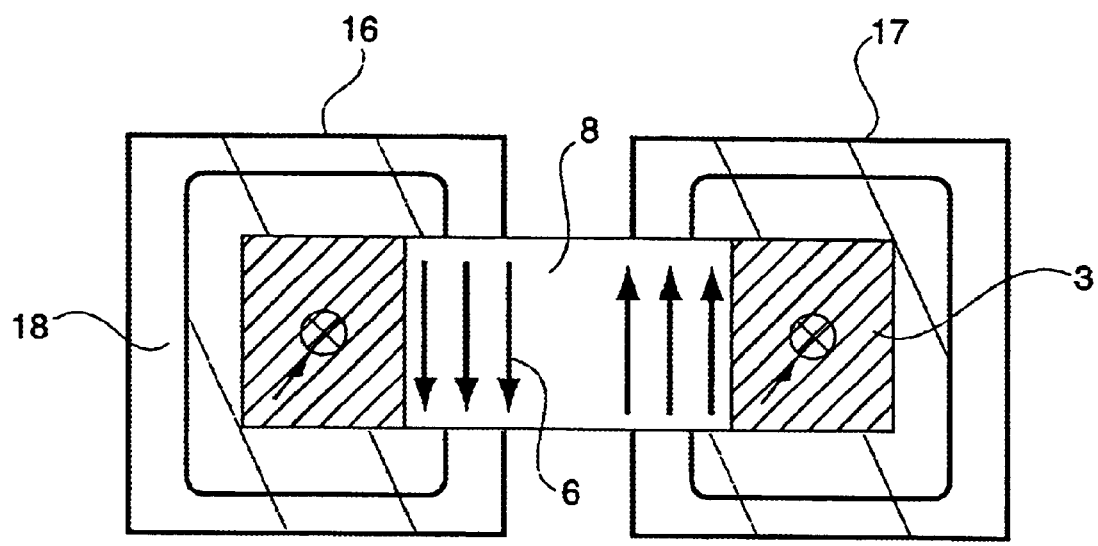
FIG. 11 shows a cross section through a slotted conductor as defined by the invention, with additional components for guiding the magnetic flux being attached to said conductor.

FIG. 11 shows a cross section trough a current conductor (3) as defined by the invention. Said current conductor is surrounded by a material that is suitable for guiding the magnetic flux. Such a material is, for example ferrite. By this measure, the flux is guided within the material in a less concentrated form (18), and a concentration (6) or direction of the magnetic flux is achieved, for example in the site where such a magnetic flux is measured. If one of the two components (16, 17) is omitted, or if the two components are produced in different sizes or from different materials, an asymmetrical field is created in relation to the recess as defined by the invention.

Figure 12:
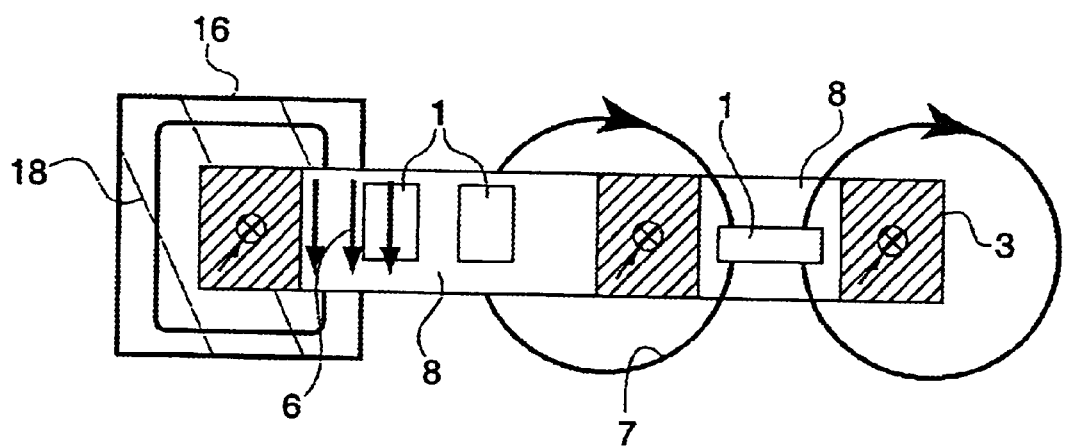
FIG. 12 shows a cross section through a conductor as defined by the invention, with two slots having different widths, whereby an additional component for guiding the magnetic flux is attached to the primary conductor.

FIG. 12 shows a cross section through a conductor (3) as defined by the invention which is provided with two recesses (8), and which creates two gradients. Said conductor, however, forms an asymmetrical gradient field because the left slot (8) is wider than the right one, and because the left part of the conductor has a component (16) for guiding the magnetic flux. The magnetic flux (6) is concentrated by said measure, so that the left magnetic field gradient measuring device (1), which is different from the right measuring device, is exposed to an asymmetrical magnetic field. The present last figure only serves the purpose of illustrating by way of example the great variety of possible embodiments of the invention.

Other devices comprising a plurality of recesses as defined by the invention are not shown here, so that the number of the figures is not increased even further.

Furthermore, other measures for creating an asymmetrical field of gradients or for an asymmetrical positioning of the magnetic field or magnetic field gradient measuring system are not shown with the help of drawings for reasons of clarity as well. Also, the representation of round, ellipsoidal, triangular, polygonal or other conductor cross sections shaped in some other ways has been omitted solely for reasons of clarity.

List of Reference Numerals and Letters

1 Magnetic field or magnetic field gradient measuring device or absolute field measuring device or gradiometer
2 Hall converter
3 Primary conductor
4 Potential-separating substrate
5 Ferrite or iron core
6 Concentrated magnetic flux
7 Field lines of the primary magnetic field
8 Slot or recess
9 Groove or recess
10 Carrier material, for example foil material
11 Part of the microsystem, for example consisting of suitable pourable casting compound
12 Conductive component
13 Conductive component
14 Joint line between the conductive components
15 Connections of the absolute field measuring devices of evaluation electronics, e.g. subtracting device 16 Component consisting of a material guiding the magnetic flux, e.g. ferrite
17 Component consisting of a material conducting the magnetic flux, e.g. ferrite
18 "guided", less concentrated magnetic flux
B Base width of a gradiometer; spacing between two absolute field measuring devices or the like.

What is claimed is:

1. The device for the potential-free measurement of a current by determining a magnetic field or its gradient caused by the current, characterized in that a conductor conducting the flow of current has at least one recess; that the recess is arranged in the conductor in a way that such the direction of the current in areas of the conductor located adjacent to the recess corresponds at least approximately; and that provision is made for at least one measuring element for determining the magnetic field or its gradient in the at least one recess, said at least one measuring element comprising a magnetic gradiometer.

2. The device according to claim 1, characterized in that the conductor consists of a plurality of components, whereby at least one recess is formed by the arrangement of the components.

3. The device according to claim 1, characterized in that the conductor is shaped straight in the direction of flow of the current in the site where the current is measured.

4. The device according to claim 1, characterized in that the at least one groove is realized in the form of a groove or slot.

5. The device according to claim 1, characterized in that for measuring individual or several gradients, one gradiometer is employed in each case whose base substrate is put up at an angle of between 0° and 90° versus the area put up by the direction of flow of the current and the center points of the two conductor components forming the respective recess, whereby the recesses of the straight conductor are shaped in a way such that the magnetic flux is guide in a manner adapted to the respective gradiometer, and that the respective gradiometers are accommodated by the recess.

6. The device according to claim 5, characterized in that the gradiometer is aligned with its base substrate inclined by about 45° or approximately orthogonal or approximately parallel in relation to the area put up by the direction of flow of the current and the center points of the two conductor components.

7. The device according to claim 1, characterized in that for measuring individual or several gradients, an arrangement of gradiometers is used in each case, said arrangement consisting of one or several gradiometers whose magnetic field-sensitive areas are arranged in the respective recess in the conductor.

8. The device according to claim 7, characterized in that at least one gradiometer is arranged in the recess in the conductor symmetrically in relation to the zero passage of the magnetic field.

9. The device according to claim 1, characterized in that for measuring individual or several gradients, use is made in each case of an arrangement of gradiometers that has one or different asymmetries in the arrangement or calibration of its magnetic field-sensitive areas in relation to the zero passage of the magnetic field, whereby the output signals of each magnetic field measuring system are linked with each other by mathematical operations in a way such that the interference components are minimized.

10. The device according to claim 9, characterized in that the arrangement of gradiometers consists of an uneven number of identical or similar gradiometers located in the area of the zero passage.

11. The device according to claim 9, characterized in that the arrangement consists of different types of or differently calibrated gradiometers.

12. The device according to claim 9, characterized in that the arrangement is realized in the form of an asymmetrical arrangement of symmetrical gradiometers in relation to the zero passage of the magnetic field.

13. The device according to claim 1, characterized in that the conductor is completely or partially surrounded by a material suitable for guiding the magnetic flux.

14. The device according to claim 1, characterized in that in the direction of flow of the current, the conductor is molded asymmetrically in relation to the one or more recesses for optimizing the magnetic field gradient.

15. The device according to claim 1, characterized in that at least one gradiometer is secured on at least one carrier by means used in microsystem technology, and positioned together with the at least one carrier in at least one recess or in the area surrounding such a recess.

16. The device according to claim 1, characterized in that the gradiometers are realized in the form of gradiometers operating based on the Hall effect.

17. The device according to claim 16, characterized in that the gradiometer are realized in the form of field boards or vertical or cylindrical, integrated Hall sensors.

18. The device according to claim 16, characterized in that the device has flux concentrating devices integrated according to the microsystem technology.

19. The device according to claim 16, characterized in that the gradiometers contain magnet-sensitive areas, the latter having been created with the use of IV- or III-V semiconductor materials by standard methods employed in the manufacture of semiconductors such as the bipolar, CMOS or BICMOS technologies.

20. The device according to claim 16, characterized in that gradiometers are realized in the form of gradiometers operating based on a combination of the principles and effects.

21. The device according to claim 1, characterized in that the gradiometers operate based on the anisotropic, gigantic, colossal or other magnetoresistive effects (AMR, GMR, CMR).

22. The device according to claim 1, characterized in that the gradiometers are realized in the form of gradiometers employing the transformational principle.

23. The device according to claim 1, characterized in that gradiometers are realized in the form of gradiometers operating based on the Josephson effect.

24. The device according to claim 1, characterized in that the device is realized in the form of a device determining values derivable from current.

25. The device according to claim 1, characterized in that at least a part of the device is screened against external electromagnetic interference fields.

26. The device according to claim 1, characterized in that the device is realized in the form of a device using the output signals of the gradiometers for detecting excess currents.

27. The device according to claim 1, characterized in that the device is designed as a unit for the potential-free measurement of current, and that said device has conductor ends that can be connected to the current conductors conducting the current to be measured.

28. The device according to claim 1, characterized in that the gradient-creating conductor is manufactured as part of a final device or contained in such a final device; and that the device for measuring the gradient is arranged in the prefabricated form in the areas surrounding the recesses.

29. The device according to claim 1, characterized in that the device is realized in the form of a device mathematically linking in the evaluation process the values measured by different gradiometers in the measurement of high currents, such values being measured in recesses of a conductor or in the areas surrounding different recesses of a conductor, in a manner such that the interference components are minimized or eliminated.

30. A method for the potential-free measurement of current with the help of a device according to claim 1, by recording a gradient caused by the respective primary current in a conductor, whereby the gradient is measured; whereby the conductor is provided with at least one recess, and whereby the measurement of the gradient is carried out in each case in the areas surrounding individual recesses.

31. The method according to claim 30, characterized in that the magnetic field gradient of a current conductor is measured, said current conductor consisting of a plurality of components, whereby the at least one recess is formed by the arrangement of the component.

* * * * *